(12) United States Patent
Kung et al.

(10) Patent No.: US 10,126,643 B2
(45) Date of Patent: Nov. 13, 2018

(54) ANTI-ESD PHOTOMASK AND METHOD OF FORMING THE SAME

(71) Applicant: TAIWAN SEMICONDUCTOR MANUFACTURING CO., LTD., Hsinchu (TW)

(72) Inventors: Chun-Hung Kung, Hsinchu (TW); Hao-Zhang Lai, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 124 days.

(21) Appl. No.: 15/419,338

(22) Filed: Jan. 30, 2017

(65) Prior Publication Data

US 2018/0164676 A1   Jun. 14, 2018

Related U.S. Application Data

(60) Provisional application No. 62/431,509, filed on Dec. 8, 2016.

(51) Int. Cl.
*G03F 1/40* (2012.01)
*H05F 1/02* (2006.01)

(52) U.S. Cl.
CPC   *G03F 1/40* (2013.01); *H05F 1/02* (2013.01)

(58) Field of Classification Search
CPC ..................................... G03F 1/40; H05F 1/02
USPC ............................................................. 430/5
See application file for complete search history.

(56) References Cited

U.S. PATENT DOCUMENTS

| 6,803,156 | B2 * | 10/2004 | Akbar | G03F 1/40 |
| | | | | 430/324 |
| 7,387,855 | B2 * | 6/2008 | Chiang | G03F 1/40 |
| | | | | 428/430 |
| 2010/0112462 | A1 * | 5/2010 | Rolfson | G03F 1/32 |
| | | | | 430/5 |
| 2011/0183239 | A1 * | 7/2011 | Park | G03F 1/22 |
| | | | | 430/5 |

* cited by examiner

*Primary Examiner* — Christopher G Young
(74) *Attorney, Agent, or Firm* — McClure, Qualey & Rodack, LLP

(57) ABSTRACT

The present disclosure provides an anti-ESD photomask and method of the same. In the method, a substrate is provided first. Then, a light-shielding layer is formed on a portion of the substrate, in which the light-shielding layer includes a Mo-containing layer. Next, a surface treatment operation is performed to convert a surface of the portion of the substrate and a surface of the light-shielding layer into a non-conductive layer.

20 Claims, 12 Drawing Sheets

ANTI-ESD PHOTOMASK AND METHOD OF FORMING THE SAME

RELATED APPLICATION

This application claims the benefit of the Provisional Application Ser. No. 62/431,509, filed Dec. 8, 2016. The entire disclosures of all the above applications are hereby incorporated by reference herein.

BACKGROUND

Among integrated circuit (IC) fabrication techniques, a photolithography process is an important technique used in forming selected circuit patterns on a substrate such as a semiconductor wafer. As integration density of IC is increasing in fabricating smaller and more complex circuits of semiconductor devices, advanced lithography techniques are accordingly required in producing smaller critical dimensions (CDs) and fine patterns.

During the photolithography process of producing a semiconductor device, light energy is applied (i.e. an exposure process) through a photomask (also referred to as a reticle) onto a photoresist material previously formed on a wafer, in order to define circuit patterns which will be etched in a subsequent process. The photomask is required to remain clean and without damage during the exposure process. However, electrostatic discharge (ESD) is likely to occur during the exposure process, and results in discharge of small current between two isolated portions of a conductive pattern (that is generally metallic, such as a light-shielding layer) on the photomask, which may melt a circuit line and destroy the circuit pattern. The small current may result from movement of electrons and electron holes coming from a photoelectric effect during the exposure process, for example, when argon fluoride (ArF) excimer laser having a wavelength of 193 nm is applied as the light energy. Damages to the circuit line and/or the circuit pattern results in defects of the produced semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2H'-FIG. 2I' are schematic cross-sectional views of intermediate stages showing a method for forming an anti-ESD photomask in accordance with various embodiments of the present disclosure.

FIG. 4J'-FIG. 4K' are schematic cross-sectional views of intermediate stages showing a method for forming an anti-ESD photomask in accordance with various embodiments of the present disclosure.

DETAILED DESCRIPTION

Figure 1A:
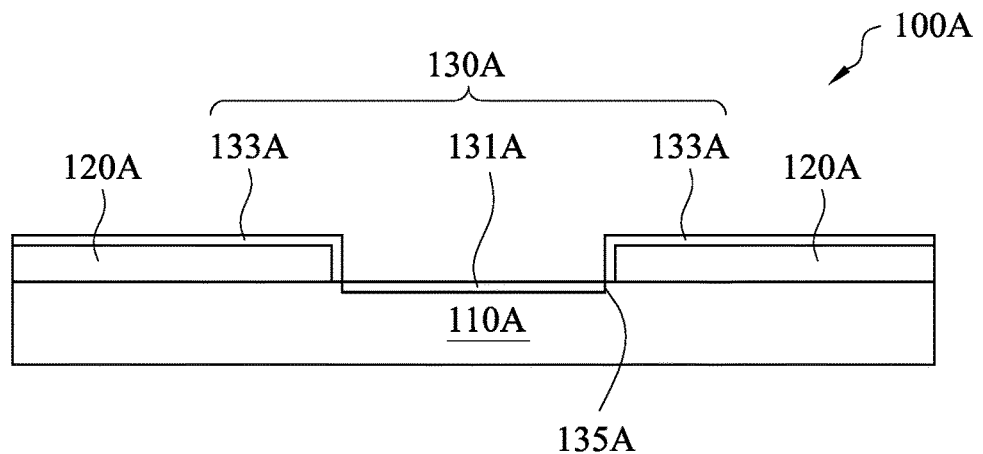
FIG. 1A and FIG. 1B illustrate schematic cross-sectional views of anti-ESD photomasks in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, the singular forms "a," "an" and "the" used herein include plural referents unless the context clearly dictates otherwise. Therefore, reference to, for example, a layer includes embodiments having two or more such layers, unless the context clearly indicates otherwise. Further, the particular features, structures, or characteristics may be combined in any suitable manner in one or more embodiments. It should be appreciated that the following figures are not drawn to scale; rather, these figures are intended for illustration.

Embodiments are directed to providing an anti-ESD photomask and a method of forming the anti-ESD photomask, in which a non-conducive layer is formed on the anti-ESD photomask to reduce conductivity on a surface of the anti-ESD photomask, and thus the mobility of electrons and electron holes on the surface will be lowered, thus reducing the ESD risk of damaging a circuit line or a circuit pattern on the photomask. In addition, the portion not covered by the light-shielding layer of the anti-ESD photomask of the present disclosure has a high light transmittance, and a critical dimension (CD) of the anti-ESD photomask remains unchanged. In various embodiments, the anti-ESD photomask is suitable for coupling with ArF excimer laser having a wavelength of 193 nm.

FIG. 1A illustrates a schematic cross-sectional view of an anti-ESD photomask 100A in accordance with various embodiments of the present disclosure. The anti-ESD photomask 100A includes a substrate 110A, a light-shielding layer 120A disposed on a portion of the substrate 110A, and a non-conductive layer 130A, in which the non-conductive layer 130A is disposed on the light-shielding layer 120A and the portion of substrate 110A. The light-shielding layer 120A includes a Mo-containing layer. In various embodiments, the non-conductive layer 130A includes a first portion 131A on the portion of the substrate 110A, and second portions 133A on the light-shielding layer 120A. In various embodiments, at least one portion of sidewalls 135A of the first portion 131A is surrounded by the substrate 110A. In various embodiments, the substrate 110A is transparent and includes quartz, silicon, silicon carbide, silicon oxide-titanium oxide alloy or combinations thereof. In various embodiments, the Mo-containing layer includes MoSi, MoSiON or a combination thereof. In one example, the Mo-containing layer may be opaque MoSi on glass (OMOG), in which light with a wavelength of 193 nm is not allowed to pass through the OMOG. In various embodiments, the first portion 131A of the non-conductive layer 130A includes oxides, nitrides and/or oxynitrides containing Si, and the second portions 133A of the non-conductive layer 130A include oxides, nitrides and/or oxynitrides containing Mo and/or Si, in which some metallic Mo atoms or other atoms possibly remain in the nonconductive layer 130A. In various embodiments, the light-shielding layer 120A includes metallic Mo of a first atomic percentage, the non-conductive layer 130A includes metallic Mo of a second atomic percentage, and the second atomic percentage is less than the first atomic percentage. In various embodiments of the present disclosure, the light-shielding layer 120A has a thickness in a range substantially range from 47 nm to 79 nm. In various embodiments, the non-conductive layer 130A may have a thickness in a range substantially from 1 nm to 3 nm. If the thickness is smaller than 1 nm, conductivity of the surface of the photomask is barely reduced, and the ESD risk cannot be avoided. If the thickness is greater than 3 nm, the light transmittance of the photomask will decrease.

Figure 1B:
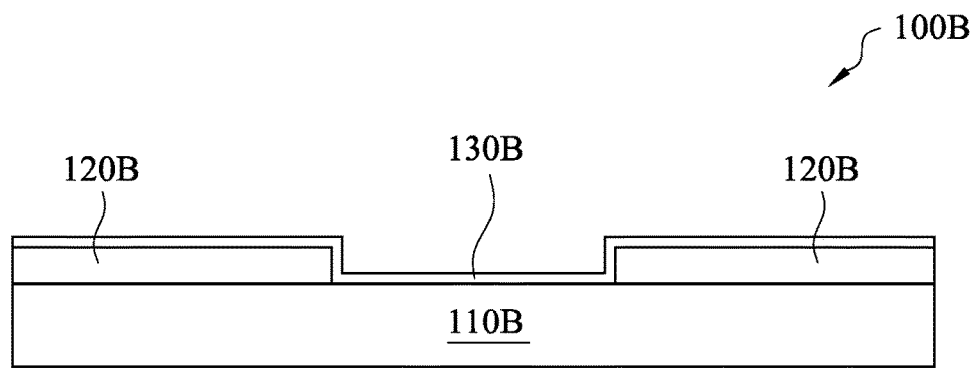

FIG. 1B illustrates a schematic cross-sectional view of an anti-ESD photomask 100B in accordance with various embodiments of the present disclosure. The anti-ESD photomask 100B includes a substrate 110B, a light-shielding layer 120B disposed on a portion of the substrate 110B, and a non-conductive layer 130B directly disposed on the light-shielding layer 120B and the portion of the substrate 110B. The light-shielding layer 120B may be a Mo-containing layer. In various embodiments, the substrate 110B is transparent and includes quartz, silicon, silicon carbide, silicon oxide-titanium oxide alloy or combinations thereof. In various embodiments, the Mo-containing layer includes MoSi, MoSiON or a combination thereof. In one example, the Mo-containing layer may be opaque MoSi on glass (OMOG), in which light with a wavelength of 193 nm is not allowed to pass through the OMOG. In various embodiments, the non-conductive layer 130B includes $SiO_2$, SiN, $MoO_2$, $MoN_2$, or a combination thereof. In various embodiments of the present disclosure, the light-shielding layer 120B has a thickness in a range substantially range from 50 nm to 80 nm. In various embodiments of the present disclosure, the non-conductive layer 130B may have a thickness in a range substantially from 1 nm to 3 nm. If the thickness is smaller than 1 nm, conductivity of the surface of the photomask is barely reduced, and the ESD risk cannot be avoided. If the thickness is greater than 3 nm, the light transmittance of the photomask will decrease.

Figure 2A:
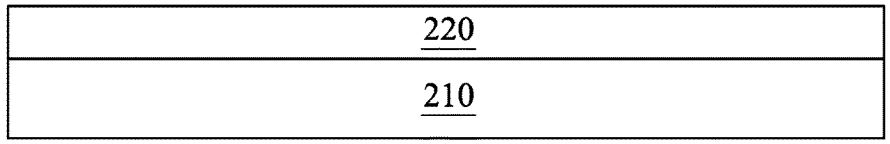
FIG. 2A-FIG. 2I are schematic cross-sectional views of intermediate stages showing a method for forming an anti-ESD photomask in accordance with various embodiments of the present disclosure.
Figure 2B:
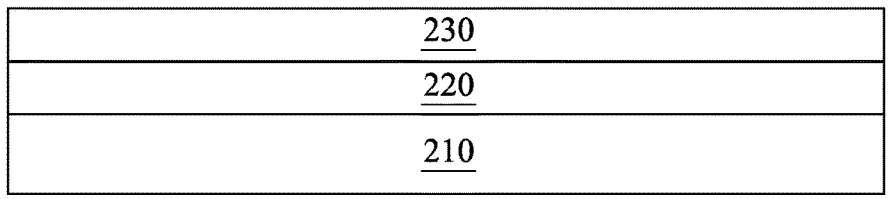
Figure 2C:
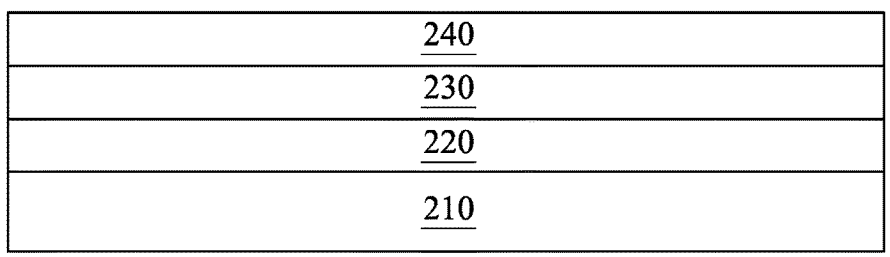
Figure 2D:
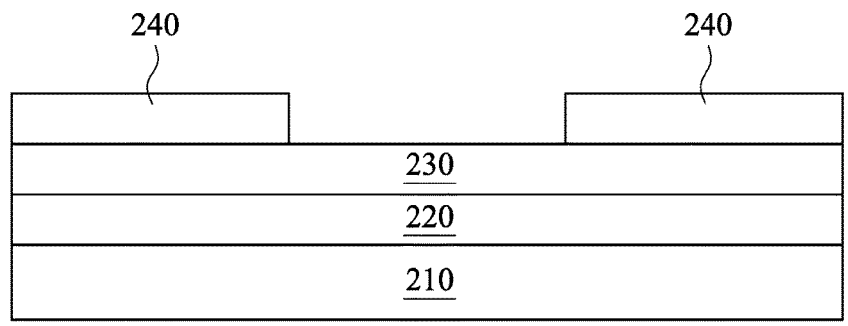
Figure 2E:
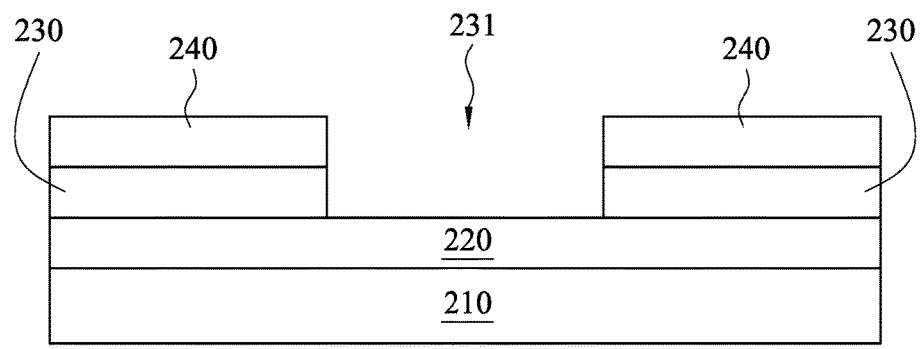
Figure 2F:
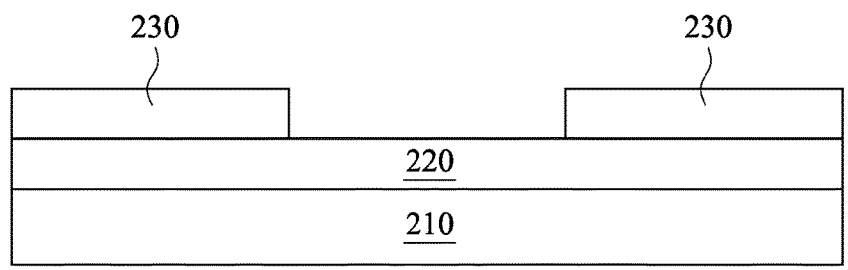
Figure 2G:
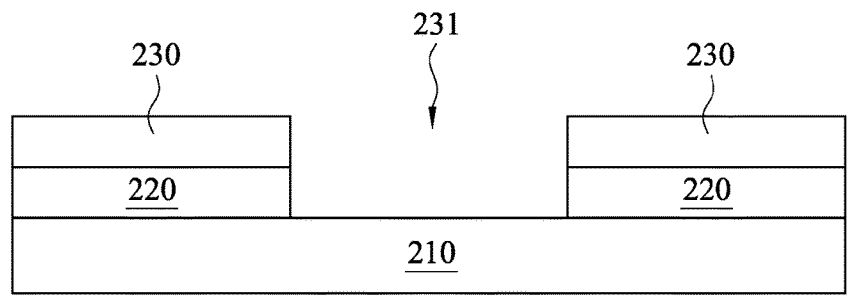
Figure 2H:
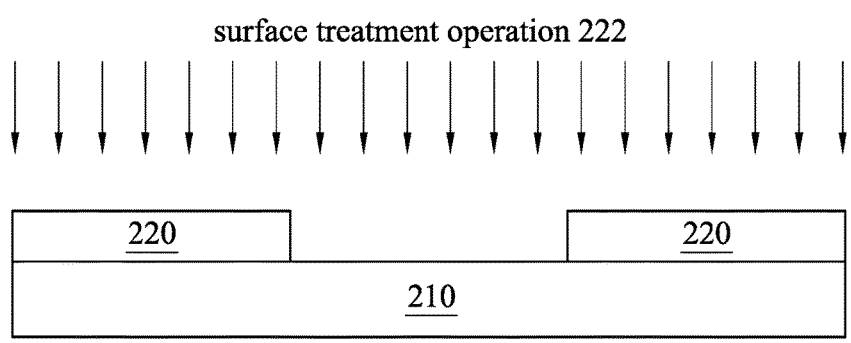
Figure 2I:
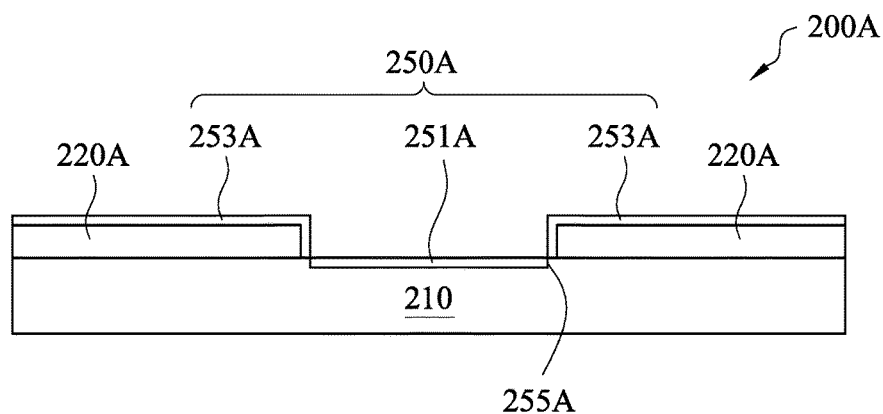
Figure 2H:
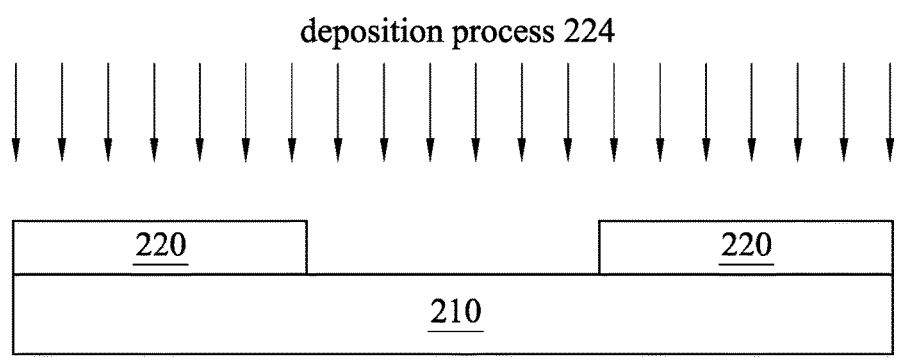
Figure 2I:
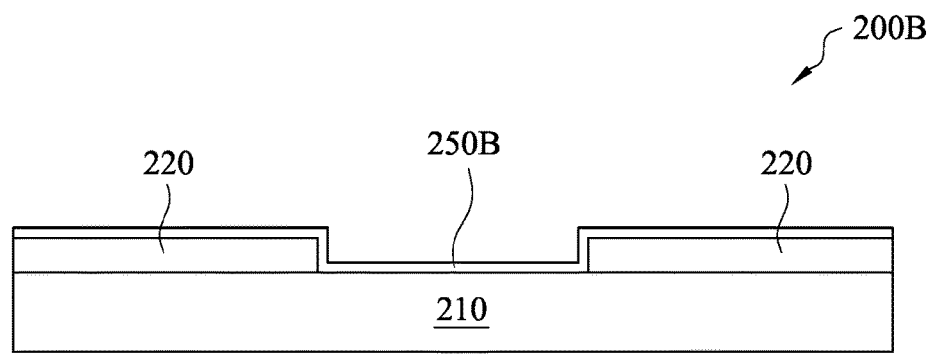

FIG. 2A to FIG. 2I and FIG. 2H' to FIG. 2I' are schematic cross-sectional views of intermediate stages showing a method for forming an anti-ESD photomask 200A and an anti-ESD photomask 200B in accordance with various embodiments of the present disclosure. Referring to FIG. 2A first, a substrate 210 is provided, and a light-shielding layer 220 is formed on the substrate 210, in which the light-shielding layer 220 includes a Mo-containing layer. In various embodiments of the present disclosure, the substrate 210 is transparent and includes quartz, silicon, silicon carbide, silicon oxide-titanium oxide alloy or combinations thereof. In various embodiments, the Mo-containing layer includes MoSi, MoSiON or a combination thereof. In various embodiments, the Mo-containing layer is opaque MoSi on glass (OMOG), in which light with a wavelength of 193 nm is not allowed to pass through the OMOG. In various embodiments, light-shielding layer 220 is formed on the substrate 210 by sputtering, chemical vapor deposition (CVD), physical vapor deposition (PVD), atomic layer deposition (ALD), and/or other suitable processes.

Next, as shown in FIG. 2B, a hardmask layer 230 is formed on the light-shielding layer 220. The hardmask layer 230 is a sacrificed layer, which transfers a pattern to the light-shielding layer 220. In various embodiments, the hardmask layer 230 may include chromium, chromium oxide, chromium nitride, chromium oxynitride, or combinations thereof. In various embodiments, the hardmask layer 230 is formed on the light-shielding layer 220 by, for example, sputtering, CVD, PVD, ALD, and/or other suitable processes.

In FIG. 2C, a photoresist layer 240 is formed on the hardmask layer 230. In various embodiments, the photoresist layer 240 includes a positive resist or a negative resist. In various embodiments, a material of the photoresist layer 240 includes an electron beam (e-beam) photoresist, which is usually applied to form more delicate and finer pattern. In some examples, the material of the photoresist layer 240 includes poly (4-t-butoxycarbonyloxystyrene), polymethylmethacrylate (PMMA), tetrafluoroethylene (TFE), or other suitable photoresist materials. The photoresist layer 240 may be formed on the hardmask layer 230 by spin-on coating with various coating tools.

In FIG. 2D, the photoresist layer 240 is patterned to form a designed layout and a portion of the hardmask layer 230 is exposed from the patterned photoresist layer 240. Typically, the design layout (i.e. the pattern) is written on the photoresist layer 240 using a mask written techniques such as electron beam writing, ion beam writing, or photolithography such as binary photolithography or phase shift photolithography.

In FIG. 2E, the hardmask layer 230 is etched until a portion of the light-shielding layer 220 is exposed (i.e. the pattern of the photoresist layer 240 is transferred to the hardmask layer 230), so as to form an opening 231. It should be noticed that the etching operation stops at the light-shielding layer 220 and exposes a portion of the light-shielding layer 220. In other words, light-shielding layer 220 is a stop layer of the etching operation. Therefore, materials and thicknesses of the light-shielding layer 220 and the hardmask layer 230 could be properly selected. In various embodiments of the present disclosure, the hardmask layer 230 has a thickness in a range substantially from 40 nm to 50 nm. In various embodiments of the present disclosure, the light-shielding layer 220 has a thickness in a range substantially range from 50 nm to 80 nm. In various embodiments, the hardmask layer 230 may be etched by dry etching process. In one example of the present disclosure, the dry etching process is performed by $Cl_2$ plasma. In another example, the dry etching process includes a chlorine and oxygen containing chemistry.

Then, as shown in FIG. 2F, the photoresist layer 240 is removed by, for example, a photoresist stripper or a plasma method.

In FIG. 2G, the light-shielding layer 220 is etched until a portion of the substrate 210 is exposed from the opening 231 using the hardmask layer 230 as a mask. In various embodiments, the light-shielding layer 220 may be etched by a dry etching process. For example, the dry etching process may be performed by $CF_4$ plasma.

In the following process, two different operations are provided to form a non-conductive layer. FIG. 2H and FIG. 2I are schematic cross-sectional views of intermediate stages for forming a non-conductive layer 250A on the exposed portion of substrate 210 and the light-shielding layer 220 using a plasma process, thereby forming an anti-ESD photomask 200A. FIG. 2H' and FIG. 2I' are schematic cross-sectional views of intermediate stages for forming a non-conductive layer 250B on the exposed portion of substrate 210 and the light-shielding layer 220 using a deposition process, thereby forming an anti-ESD photomask 200B. It is noted that photomask stack structures applied in FIG. 2H and FIG. 2H' may be formed by operations similar to or same as the operations shown in FIG. 2A to FIG. 2G, and thus a detailed descriptions are not repeated in the following operations.

Next, please refer to FIG. 2H and FIG. 2I, the hardmask layer 230 in FIG. 2G is removed by, for example, a wet cleaning method, and the light-shielding layer 220 and the portion of the substrate 210 exposed from the opening 231 are subjected to a surface treatment operation 222, thereby forming the anti-ESD photomask 200A of FIG. 2I. The surface treatment operation 222 is aimed at converting a surface of the exposed portion of the substrate 210 and a surface of the light-shielding layer 220 into a non-conductive layer 250A including a first portion 251A and second portions 253A, in which a light-shielding layer 220A having a reduced dimension is formed. In various embodiments, the surface treatment operation 222 may be performed using oxygen ($O_2$) plasma or nitrogen ($N_2$) plasma. In various embodiments, at least one portion of sidewalls 255A of the first portion 251A of the non-conductive layer 250A is surrounded by the substrate 210. In various embodiments of the present disclosure, the non-conductive layer 250A may have a thickness in a range substantially from 1 nm to 3 nm. If the thickness is smaller than 1 nm, conductivity of the surface of the photomask is barely reduced, and the ESD risk cannot be avoided. If the thickness is greater than 3 nm, the light transmittance of the photomask will decrease. In various embodiments of the present disclosure, the light-shielding layer 220A has a thickness in a range substantially range from 47 nm to 79 nm. In various embodiments, the first portion 251A of the non-conductive layer 250 includes oxides, nitrides and/or oxynitrides containing Si, the second portions 253A of the non-conductive layer 250 includes oxides, nitrides and/or oxynitrides containing Mo and/or Si, in which some metallic Mo atoms or other atoms possibly remain in the nonconductive layer 250A. In various embodiments, the light-shielding layer 220A includes metallic Mo of a first atomic percentage, the non-conductive layer 250A includes metallic Mo of a second atomic percentage, and the second atomic percentage is less than the first atomic percentage.

In various embodiments, an anti-ESD photomask 200B is formed by schematic cross-sectional views of intermediate stages shown in FIG. 2H' and FIG. 2I'. Please refer to FIG. 2H' and FIG. 2I', the hardmask layer 230 in FIG. 2G is removed by, for example, a wet cleaning method, and a non-conductive layer 250B is directly formed on the light-shielding layer 220 and the exposed portion of the substrate 210. In various embodiments, the non-conductive layer 250B is formed by a deposition process 224 such as a chemical vapor deposition (CVD) process, plasma-enhanced CVD process (PECVD), a physical vapor deposition (PVD) process or an atomic layer deposition (ALD) process. In various embodiments, the non-conductive layer 250B includes $SiO_2$, SiN, $MoO_2$, $MoN_2$, or a combination thereof.

In various embodiments of the present disclosure, the light-shielding layer 220 has a thickness in a range substantially range from 50 nm to 80 nm. In various embodiments of the present disclosure, the non-conductive layer 250B can have a thickness in a range substantially from 1 nm to 3 nm. If the thickness is smaller than 1 nm, conductivity of the surface of the photomask is barely reduced, and the ESD risk cannot be avoided. If the thickness is greater than 3 nm, the light transmittance of the photomask will decrease.

Figure 3A:
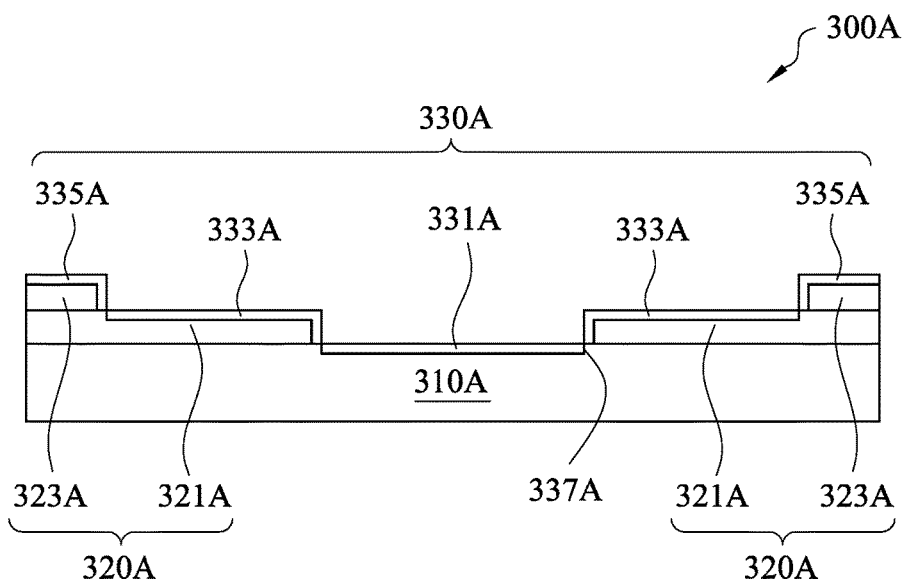
FIG. 3A and FIG. 3B illustrate schematic cross-sectional views of anti-ESD photomasks in accordance with various embodiments of the present disclosure.

FIG. 3A illustrates a schematic cross-sectional view of an anti-ESD photomask 300A in accordance with various embodiments of the present disclosure. The anti-ESD photomask 300A includes a substrate 310A, a light-shielding layer 320A disposed on a portion of the substrate 310A, and a non-conductive layer 330A, in which the non-conductive layer 330A is disposed on the portion of the substrate 310A and the light-shielding layer 320A. The light-shielding layer 320A includes a Mo-containing layer 321A and an opaque layer 323A, in which the opaque layer 323A disposed on a portion of the Mo-containing layer 321A. In various embodiments, the non-conductive layer 330A includes a first portion 331A on the portion of the substrate 310A, second portions 333A on the portion of the Mo-containing layer 321A, and third portions 335A on the opaque layer 323A. In various embodiments, at least one portion of sidewalls 337A of the first portion 331A of the non-conductive layer 330A is surrounded by the substrate 310A. In various embodiments, the substrate 310A is transparent and includes quartz, silicon, silicon carbide, silicon oxide-titanium oxide alloy or combinations thereof. In various embodiments, the Mo-containing layer 321A includes MoSi, MoSiON or a combination thereof. In one example, a light (e.g. ArF excimer laser having a wavelength of 193 nm) transmittance of the Mo-containing layer 321A may be in a range from about 6% to about 9%, in which the Mo-containing layer 321A is usually used in an attenuated phase shift mask (att-PSM) or an alternating phase shift mask (alt-PSM). In various embodiments, the opaque layer 323A may include chromium, chromium oxides, chromium nitrides, chromium oxynitrides, or combinations thereof. In various embodiments, the first portion 331A of the non-conductive layer 330A includes oxides, nitrides and/or oxynitrides containing Si, the second portions 333A of the nonconductive layer 330A includes oxides, nitrides and/or oxynitrides containing Mo and/or Si, and the thirds portion 335A of the non-conductive layer 330A includes oxides, nitrides and/or oxynitrides containing Cr, in which some metallic Mo atoms or other atoms possibly remain in the nonconductive layer 330A. In various embodiments, the Mo-containing layer 321A includes metallic Mo of a first atomic percentage, the non-conductive layer 330A includes metallic Mo of a second atomic percentage, and the second atomic percentage is less than the first atomic percentage. In various embodiments of the present disclosure, the Mo-containing layer 321A may have a thickness in a range substantially from 47 nm to 79 nm. In various embodiments of the present disclosure, the opaque layer 323A may have a thickness substantially less than 99 nm. In various embodiments of the present disclosure, the non-conductive layer 330A may have a thickness in a range substantially from 1 nm to 3 nm. If the thickness is smaller than 1 nm, conductivity of the surface of the photomask is barely reduced, and the ESD risk cannot be avoided. If the thickness is greater than 3 nm, the light transmittance of the photomask will decrease.

Figure 3B:
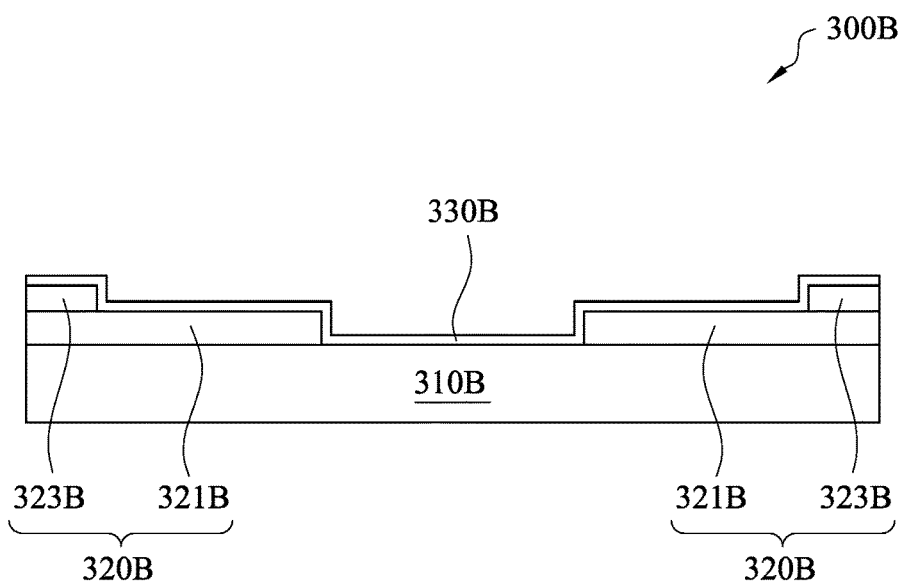

FIG. 3B illustrates a schematic cross-sectional view of an anti-ESD photomask in accordance with various embodiments of the present disclosure. The anti-ESD photomask 300B includes a substrate 310B, a light-shielding layer 320B disposed on a portion of the substrate 310B, and a non-conductive layer 330B directly disposed on the light-shielding layer 320B and the portion of the substrate 310B. The light-shielding layer 320B includes a Mo-containing layer 321B and an opaque layer 323B, in which the opaque layer 323B is disposed on a portion of the Mo-containing layer 321B. In various embodiments, the substrate 310B is transparent and includes quartz, silicon, silicon carbide, silicon oxide-titanium oxide alloy or combinations thereof. In various embodiments, the Mo-containing layer 321B includes MoSi, MoSiON or a combination thereof. In one example, a light (e.g. ArF excimer laser having a wavelength of 193 nm) transmittance of the Mo-containing layer 321B may be in a range from about 6% to about 9%, in which the Mo-containing layer 321B is usually used in an attenuated phase shift mask (att-PSM) or an alternating phase shift mask (alt-PSM). In various embodiments, the opaque layer 323B may include chromium, chromium oxide, chromium nitride, chromium oxynitride, or combinations thereof. In various embodiments, the non-conductive layer 330B includes $SiO_2$, SiN, $MoO_2$, $MoN_2$, or a combination thereof. In various embodiments of the present disclosure, the Mo-containing layer 321B has a thickness in a range substantially range from 50 nm to 80 nm. In various embodiments of the present disclosure, the opaque layer 323B may have a thickness substantially less than 100 nm. In various embodiments of the present disclosure, the non-conductive layer 330B may have a thickness in a range substantially from 1 nm to 3 nm. If the thickness is smaller than 1 nm, conductivity of the surface of the photomask is barely reduced, and the ESD risk cannot be avoided. If the thickness is greater than 3 nm, the light transmittance of the photomask will decrease.

Figure 4A:
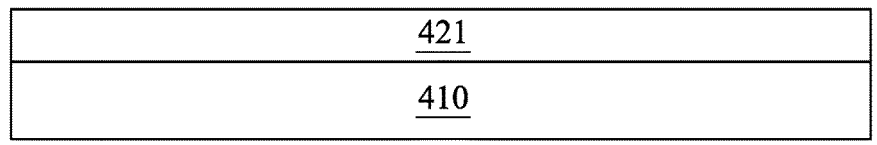
FIG. 4A-FIG. 4K are schematic cross-sectional views of intermediate stages showing a method for forming an anti-ESD photomask in accordance with various embodiments of the present disclosure.
Figure 4B:
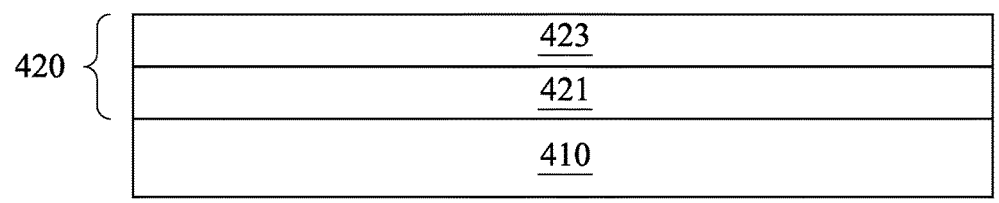
Figure 4C:
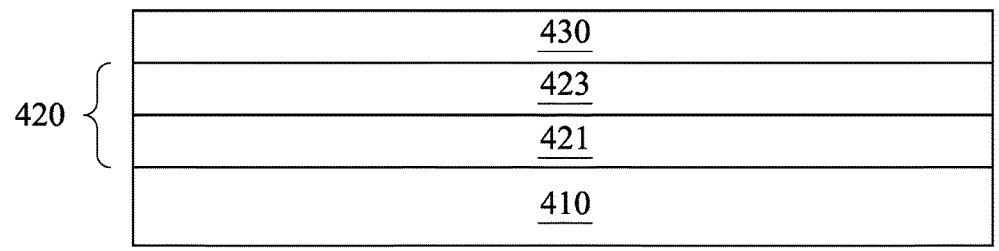
Figure 4D:
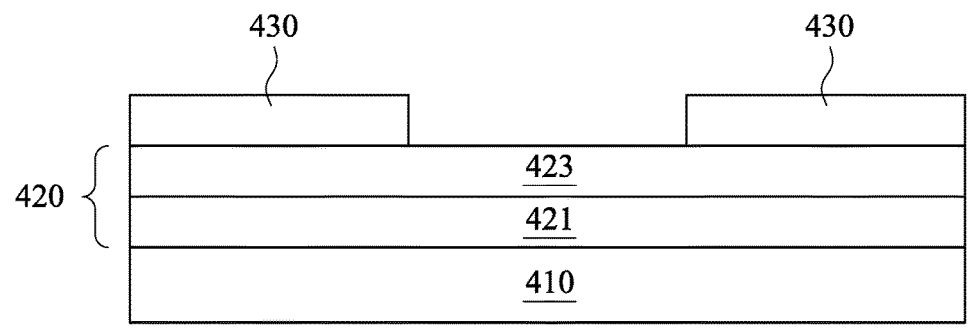
Figure 4E:
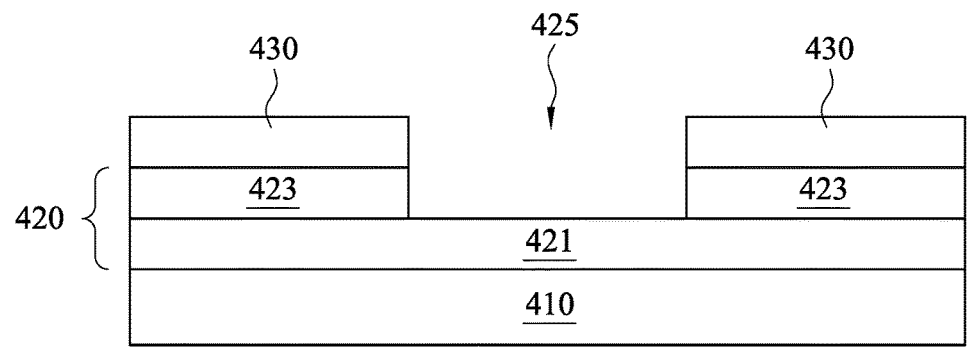
Figure 4F:
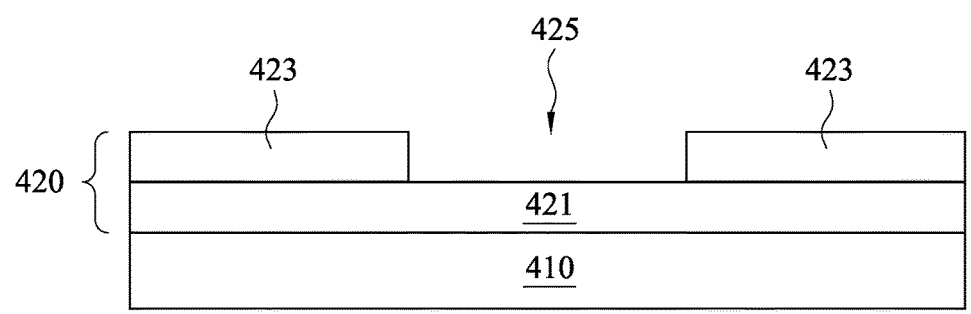
Figure 4G:
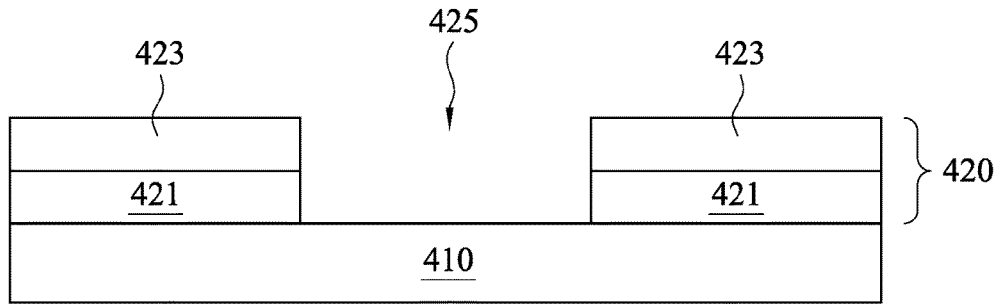
Figure 4H:
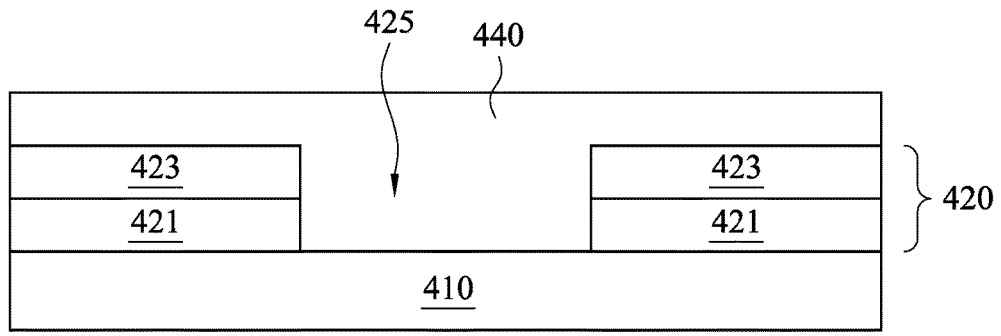
Figure 4I:
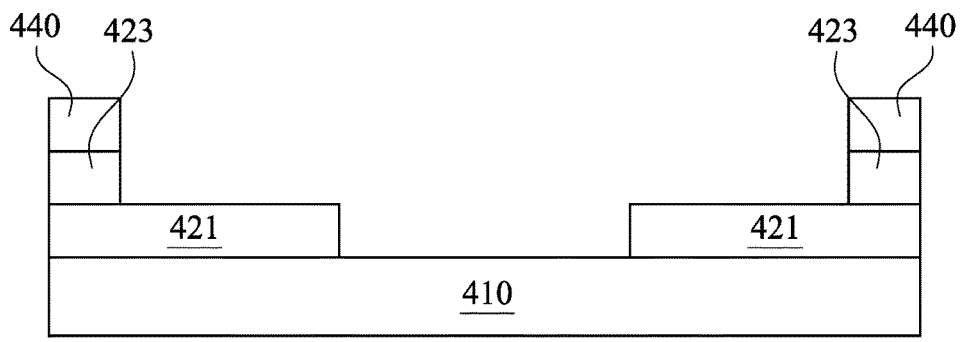
Figure 4J:
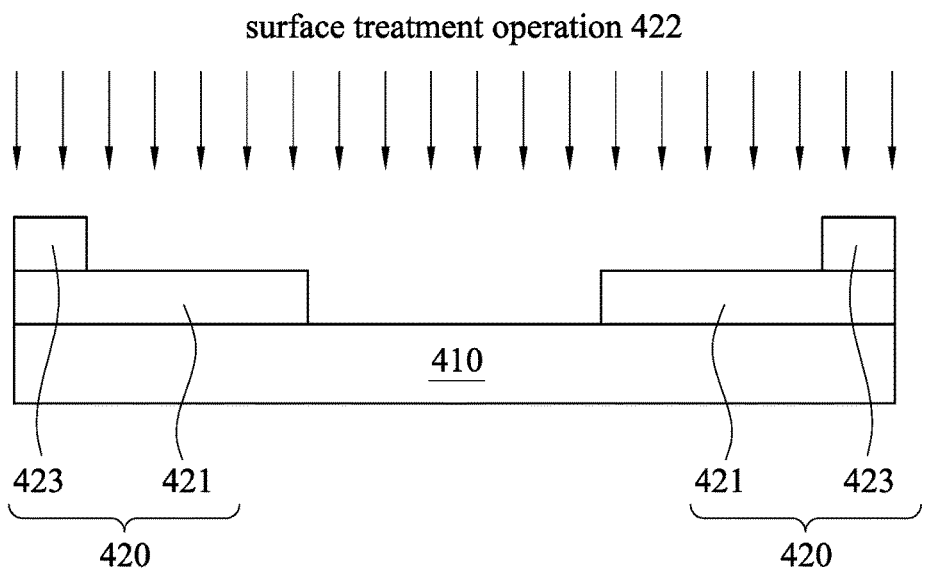
Figure 4K:
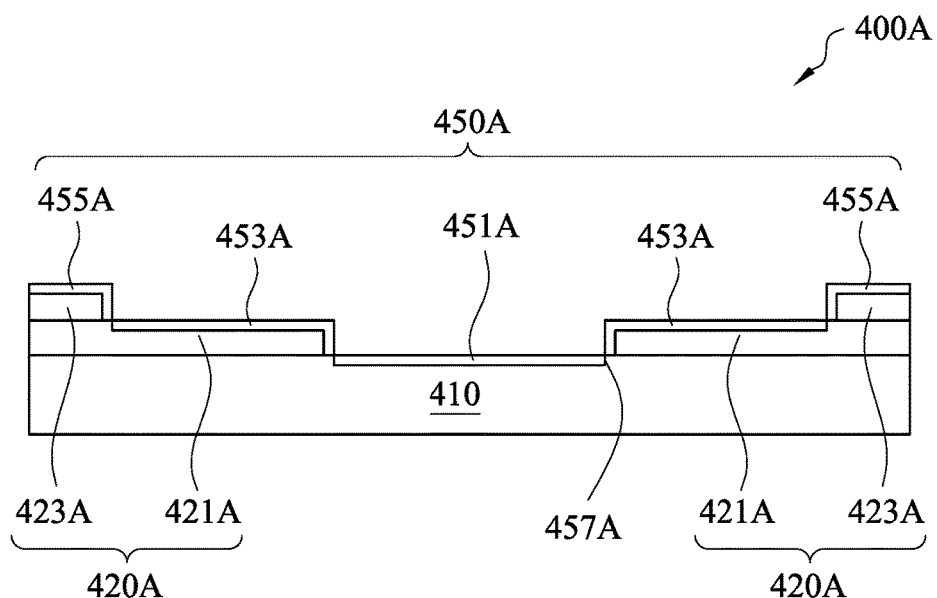
Figure 4J:
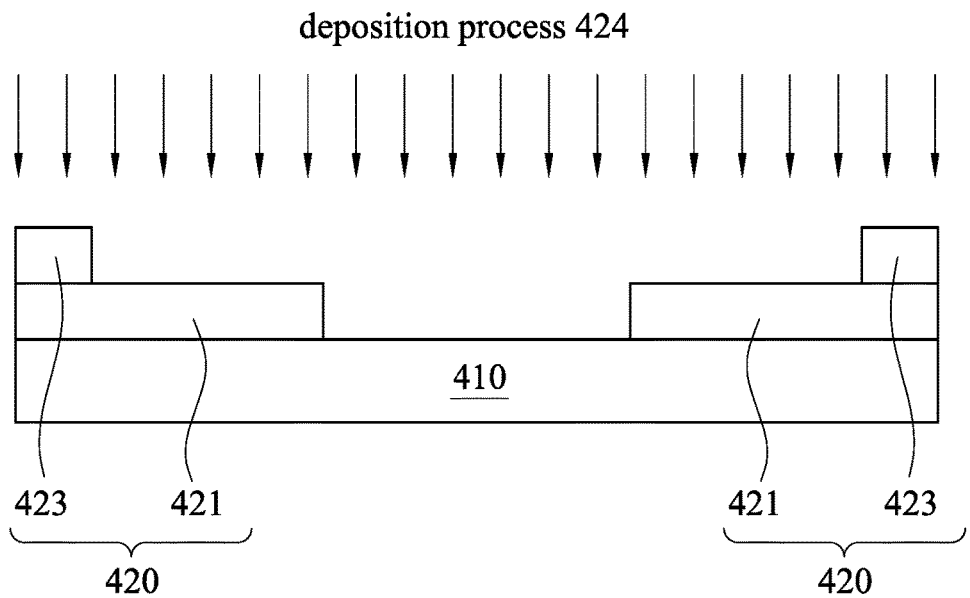
Figure 4K:
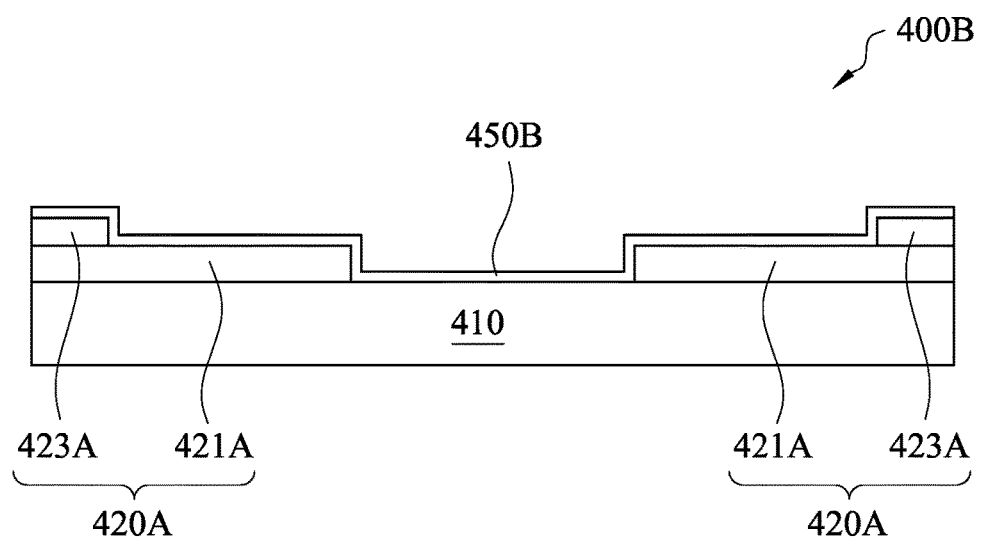

FIG. 4A to FIG. 4K and FIG. 4J' to FIG. 4K' are schematic cross-sectional views of intermediate stages showing a method for forming an anti-ESD photomask 400A and an anti-ESD photomask 400B in accordance with various embodiments of the present disclosure. Referring to FIG. 4A first, a substrate 410 is provided, and a Mo-containing layer 421 is formed on the substrate 410. In various embodiments of the present disclosure, the substrate 410 is transparent and includes quartz, silicon, silicon carbide, silicon oxide-titanium oxide alloy or combinations thereof. In various embodiments, the Mo-containing layer 421 includes MoSi, MoSiON or a combination thereof. In one example, a light (e.g. ArF excimer laser having a wavelength of 193 nm) transmittance of the Mo-containing layer 421 may be in a range from about 6% to about 9%, in which the Mo-containing layer 421 is usually used in an attenuated phase shift mask (att-PSM) or an alternating phase shift mask (alt-PSM). In various embodiments, the Mo-containing layer 421 may be formed on the substrate 410 by sputtering, CVD, PVD, ALD, and/or other suitable processes.

Next, as shown in FIG. 4B, an opaque layer 423 is formed on the Mo-containing layer 421, in which a light-shielding layer 420 includes the Mo-containing layer 421 and the opaque layer 423. The opaque layer 423 prevents light transmitting from the edge of the Mo-containing layer 421, so as to isolate each pattern formed on the photomask 400A (FIG. 4K) and the photomask 400B (FIG. 4K'). In various embodiments, the opaque layer 423 may include chromium, chromium oxide, chromium nitride, chromium oxynitride, or combinations thereof. The opaque layer 423 may be formed on the Mo-containing layer 421 by, for example, sputtering, CVD, PVD, ALD, and/or other suitable processes.

In FIG. 4C, a first photoresist layer 430 is formed on the opaque layer 423. In various embodiments, the first photoresist layer 430 may be a positive resist or a negative resist. In an example of the present disclosure, a material of the first photoresist layer 430 may include an electron beam photoresist, which is usually used to form more delicate and finer pattern. In some examples, the material of the first photoresist layer 430 includes poly (4-t-butoxycarbonyloxystyrene), polymethylmethacrylate (PMMA), tetrafluoroethylene (TFE), or other suitable photoresist materials. The first photoresist layer 430 may be formed on the opaque layer 423 by using spin-on coating with various coating tools.

In FIG. 4D, the first photoresist layer 430 is patterned to form a designed layout and a portion of the opaque layer 423 is exposed from the patterned first photoresist layer 430. Typically, the design layout (i.e. the pattern) is written on the first photoresist layer 430 using a mask written techniques such as electron beam writing, ion beam writing, or photolithography such as binary photolithography or phase shift photolithography.

In FIG. 4E, the opaque layer 423 is etched until a portion of the Mo-containing layer 421 is exposed (i.e. the pattern of the first photoresist layer 430 is transferred to the opaque layer 423), so as to form an opening 425. It should be noticed that the etching operation stops at the Mo-containing layer 421 and exposes a portion of the Mo-containing layer 421. In other words, Mo-containing layer 421 is a stop layer of the etching operation. Therefore, materials and thicknesses of the Mo-containing layer 421 and the opaque layer 423 could be properly selected. In various embodiments of the present disclosure, the opaque layer 423 has a thickness substantially less than 100 nm. In various embodiments of the present disclosure, the Mo-containing layer 421 has a thickness in a range substantially range from 50 nm to 80 nm. In various embodiments, the opaque layer 423 may be etched by dry etching process. In one example of the present disclosure, the dry etching process may be performed by $Cl_2$ plasma. In another example, the dry etching process includes a chlorine and oxygen containing chemistry.

Then, as shown in FIG. 4F, the first photoresist layer 430 is removed by, for example, a photoresist stripper or a plasma method.

In FIG. 4G, the Mo-containing layer 421 is etched until a portion of the substrate 410 is exposed from the opening 425 using the opaque layer 423 as a mask. In various embodiments, the Mo-containing layer 421 may be etched by a dry etching process. For example, the dry process may be performed by $CF_4$ plasma.

In FIG. 4H, a second photoresist layer 440 is filled into the opening 425 and formed on the exposed portion of the substrate 410 and the opaque layer 423. In various embodiments, a material of the second photoresist layer 440 includes a conventional optical photoresist which is usually coupled with a laser beam, and the material may be a positive photoresist or a negative photoresist. The second photoresist layer 440 is used to transfer a pattern to the opaque layer 423 such that the opaque layer 423 prevents light from passing through the edge of the anti-ESD photomask 400A (FIG. 4K) and the anti-ESD photomask 400B (FIG. 4K'), so as to isolate each pattern formed on the anti-ESD photomasks.

In FIG. 4I, the second photoresist layer 440 is patterned, followed by etching the opaque layer 423 until a portion of the Mo-containing layer 421 is exposed. In various embodiments, the operation of etching the opaque layer 423 uses the patterned second photoresist layer 440 as a mask. In various embodiments, the operation of etching the opaque layer 423 may be performed using a dry etching process. In one example of the present disclosure, the dry etching process may be performed by $Cl_2$ plasma. In another example, the dry etching process includes a chlorine and oxygen containing chemistry.

In the following process, two different operations are provided to form a non-conductive layer. FIG. 4J and FIG. 4K are schematic cross-sectional views of intermediate stages for forming a non-conductive layer 450A on the exposed portion of substrate 410 and the light-shielding layer 420 using a plasma process, thereby forming an anti-ESD photomask 400A. FIG. 4J' and FIG. 4K' are schematic cross-sectional views of intermediate stages for forming a non-conductive layer 450B on the exposed portion of substrate 410 and the light-shielding layer 420 using a deposition process, thereby forming an anti-ESD photomask 400B. It is noted that photomask stack structures applied in FIG. 4J and FIG. 4J' may be formed by operations similar to or same as the operations shown in FIG. 4A to FIG. 4I, and thus a detailed descriptions are not repeated in the following operations.

In FIG. 4J and FIG. 4K, the second photoresist layer 440 in FIG. 4I is removed, followed by subjecting the exposed portion of the substrate 410, the exposed portion of the Mo-containing layer 421 and the opaque layer 423 (i.e. the light-shielding layer 420) to a surface treatment operation 422, thereby forming the anti-ESD photomask 400A of FIG. 4K. During the surface treatment operation 422, a surface of the exposed portion of the substrate 410, a surface of the exposed portion of the Mo-containing layer 421 and a surface of the opaque layer 423 are converted into a non-conductive layer 450A including a first portion 451A, second portions 453A and third portions 455A, in which the Mo-containing layer 421A and the opaque layer 423A (i.e. a light-shielding layer 420A) having reduced dimensions are formed. In various embodiments, at least one portion of sidewalls 457A of the first portion 451A of the non-conductive layer 450A is surrounded by the substrate 410A. In various embodiments, the surface treatment operation 422 may be performed using oxygen ($O_2$) plasma or nitrogen ($N_2$) plasma. In various embodiments of the present disclosure, the non-conductive layer 450A may have a thickness in a range substantially from 1 nm to 3 nm. If the thickness is smaller than 1 nm, conductivity of the surface of the photomask is barely reduced, and the ESD risk cannot be avoided. If the thickness is greater than 3 nm, the light transmittance of the photomask will decrease. In one example, the thickness of the non-conductive layer 450A is 2 nm. In various embodiments of the present disclosure, the Mo-containing layer 421A may have a thickness in a range substantially from 47 nm to 79 nm. In various embodiments of the present disclosure, the opaque layer 423A may have a thickness substantially less than 99 nm. In various embodiments, the first portion 451A of the non-conductive layer 450A includes oxides, nitrides and/or oxynitrides containing Si, the second portions 453A of the nonconductive layer 450A includes oxides, nitrides and/or oxynitrides containing Mo and/or Si, and the thirds portion 455A of the non-conductive layer 450A includes oxides, nitrides and/or oxynitrides containing Cr, in which some metallic Mo atoms or other atoms remain in the nonconductive layer 450A. In various embodiments, the Mo-containing layer 421A includes metallic Mo of a first atomic percentage, the non-conductive layer 450A includes metallic Mo of a second atomic percentage, and the second atomic percentage is less than the first atomic percentage. The surface treatment operation 422 effectively lowers down the percentage of the metallic Mo on the surface of the anti-ESD photomask 400A, and thus the conductivity of the surface of the anti-ESD photomask 400A decreases. The mobility of the electrons and the electron holes will be lowered due to reduction of the conductivity, and the ESD risk is effectively reduced or avoided. In some examples, the atomic percentage of the metallic Mo on the surface of the Mo-containing layer is reduced from 7 atomic % (at. %)~8 at. % to 2 at. %~3 at. %. In other examples, when the anti-ESD photomask of the present disclosure is coupled with ArF excimer laser having a wavelength of 193 nm to produce a 16 nm semiconductor device, more than 99% defects resulted from ESD are reduced.

In various embodiments, an anti-ESD photomask 400B is formed by schematic cross-sectional views of intermediate stages shown in FIG. 4J' and FIG. 4K'. In FIG. 4J' and FIG. 4K', the second photoresist layer 440 in FIG. 4I is removed, and then a non-conductive layer 450B is directly formed on the exposed portion of the substrate 410, a exposed portion of the Mo-containing layer 421 and the opaque layer 423 (i.e. the light-shielding layer 420). In various embodiments, the non-conductive layer 450B is formed by a deposition process 424 such as CVD, PECVD, PVD or ALD. In various embodiments, the non-conductive layer 450B includes $SiO_2$, SiN, $MoO_2$, $MoN_2$, or a combination thereof. In various embodiments of the present disclosure, the Mo-containing layer 421 of the anti-ESD photomask 400B has a thickness in a range substantially range from 50 nm to 80 nm. In various embodiments of the present disclosure, the opaque layer 423 of the anti-ESD photomask 400B may have a thickness substantially less than 100 nm. In various embodiments of the present disclosure, the non-conductive layer 450B of the anti-ESD photomask 400B can have a thickness in a range substantially from 1 nm to 3 nm. If the thickness is smaller than 1 nm, conductivity of the surface of the photomask is barely reduced, and the ESD risk cannot be avoided. If the thickness is greater than 3 nm, the light transmittance of the photomask will decrease.

In various embodiments, the anti-ESD photomask of the present disclosure includes a super binary photomask (i.e. OMOG), an att-PSM, an alt-PSM and the like. In various embodiments, the anti-ESD photomask is suitable for coupling with ArF excimer laser having a wavelength of 193 nm.

Figure 5:
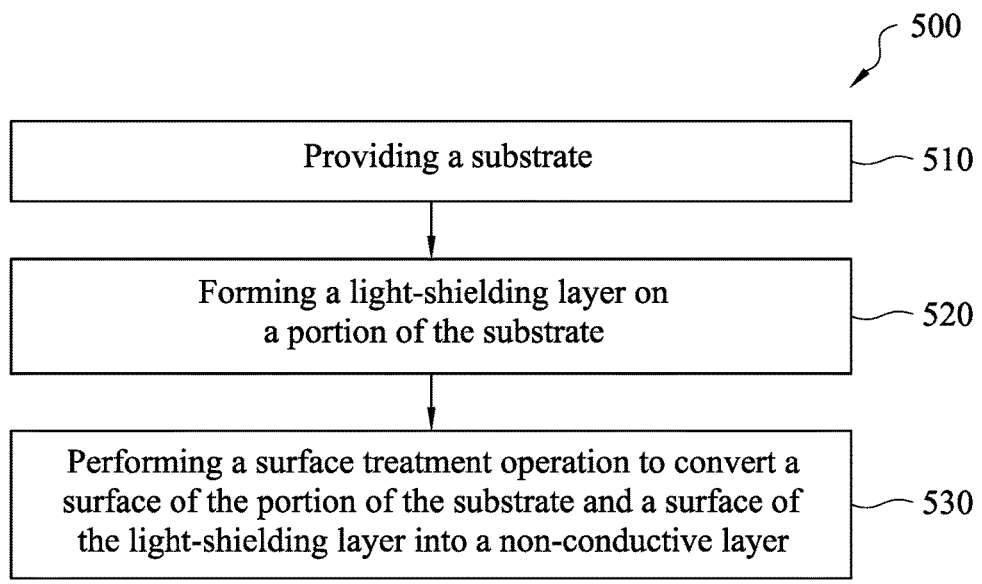
FIG. 5 illustrates a flow chart of forming an anti-ESD photomask in accordance with various embodiments of the present disclosure.
Figure 6:
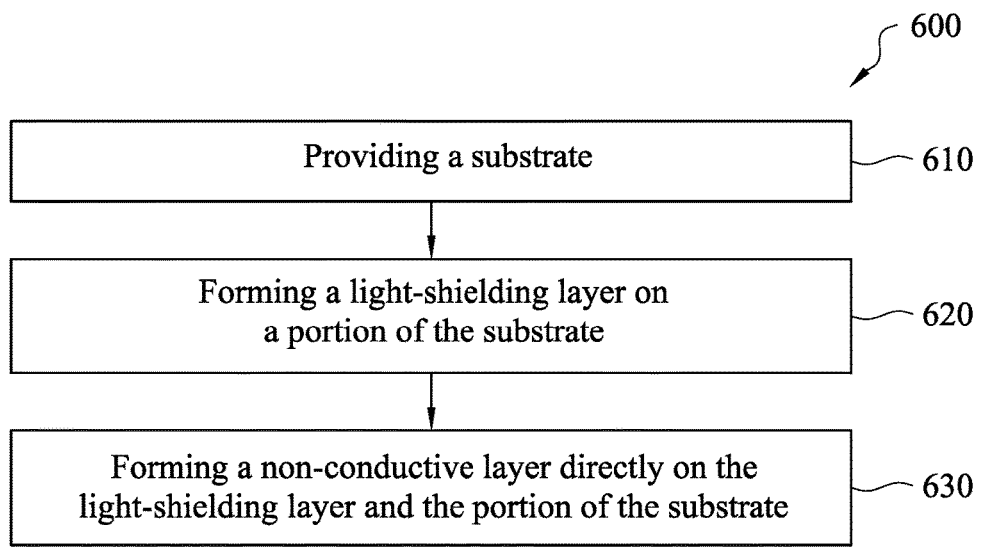
FIG. 6 illustrates a flow chart of forming an anti-ESD photomask in accordance with various embodiments of the present disclosure.

FIG. 5 illustrates a flow chart of a method 500 for forming an anti-ESD photomask in accordance to some embodiments of the present disclosure. FIG. 6 illustrates a flow chart of a method 600 for forming an anti-ESD photomask in accordance to some embodiments of the present disclosure. Although the method 500 is described in relation to FIG. 2A~FIG. 2I and FIG. 4A~FIG. 4K and the method 600 is described in relation to FIG. 2H'~FIG. 2I' and FIG. 4J'~FIG. 4K', it will be appreciated that the method 500 and the method 600 are not limited to such structures, but instead may stand alone as a method independent of the structures. Furthermore, while the disclosed method 500 and the method 600 are illustrated and described herein as a series of operations, acts or events, it will be appreciated that the illustrated ordering of such operations, acts or events are not to be interpreted in a limiting sense. For example, some operations may occur in different orders and/or concurrently with other operations, acts or events apart from those illustrated and/or described herein. In addition, not all illustrated operations may be required to implement one or more aspects or embodiments of the description herein. Further, one or more of the operations depicted herein may be carried out in one or more separate operations and/or phases.

Please refer to FIG. 5, at operation 510, a substrate is provided first, as shown in FIG. 2A and FIG. 4A. At operation 520, a light-shielding layer is formed on a portion of the substrate, as shown in FIG. 2B to FIG. 2G and FIG. 4B to FIG. 4I.

In some embodiments, the operation 520 includes the following operations: forming a light-shielding layer (e.g. the Mo-containing layer 220 of FIG. 2A); forming a hardmask layer (e.g. the hardmask layer 230 of FIG. 2B) on the light-shielding layer; forming a photoresist layer (e.g. the photoresist layer 240 of FIG. 2C) on the hardmask layer; patterning the photoresist layer (as shown in FIG. 2D); etching the hardmask layer using the patterned photoresist layer as a mask (as shown in FIG. 2E); removing the patterned photoresist layer (as shown in FIG. 2F); etching the light-shielding layer using the hardmask layer as a mask (as shown in FIG. 2G); and, removing the hardmask layer (not shown), so as to form the light-shielding layer including the Mo-containing layer.

In other embodiments, the operation 520 includes the following operations: forming a light-shielding layer, in which the light-shielding layer includes a Mo-containing layer and an opaque layer on the Mo-containing layer (e.g. the Mo-containing layer 421 and an opaque layer 423 of FIG. 4B); forming a first photoresist layer (e.g. the first photoresist layer 430 of FIG. 4C) on the opaque layer; patterning the first photoresist layer (as shown in FIG. 4D); etching the opaque layer using the patterned first photoresist layer as a mask (as shown in FIG. 4E); removing the patterned first photoresist layer (as shown in FIG. 4F); etching the Mo-containing layer using the opaque layer as a mask (as shown in FIG. 4G); forming a second photoresist layer (e.g. the second photoresist layer 440 of FIG. 4H); patterning the second photoresist layer and etching the opaque layer using the patterned second photoresist layer as a mask (as shown in FIG. 4I); and, removing the patterned second photoresist layer (not shown), so as to form the light-shielding layer including the Mo-containing layer and the opaque layer disposed on the Mo-containing layer, in which a portion of the Mo-containing layer is exposed from the opaque layer.

At operation 530, a surface treatment operation is performed to convert a surface of the portion of the substrate and a surface of the light-shielding layer into a non-conductive layer, as shown in FIG. 2H and FIG. 4J. An anti-ESD photomask (e.g. the anti-ESD photomask 200A of FIG. 2I and the anti-ESD photomask 400A of FIG. 4K) of the present disclosure is formed by the aforementioned operations.

The method 600 begins with an operation 610 in which a substrate is provided first. At operation 620, a light-shielding layer is formed on a portion of the substrate. A detailed description for the operations 610 and 620 is similar to the operations 510 and 520 rather than further described here.

At operation 630, a non-conductive layer is directly formed on the light-shielding layer and the portion of the substrate, as shown in FIG. 2H' and FIG. 4J'. An anti-ESD photomask (e.g. the anti-ESD photomask 200B of FIG. 2I' and the anti-ESD photomask 400B of FIG. 4K') of the present disclosure is formed by the aforementioned operations.

The present disclosure provides an anti-ESD photomask and a method of forming the anti-ESD photomask. Formation of a non-conductive layer on a surface of the anti-ESD photomask effectively reduces the ESD risk. The atomic percentage of the metallic Mo on the surface of the photomask is reduced, leading to reduced conductivity. Accordingly, the mobility of electrons and electron holes will be lowered, thereby reducing the ESD risk. In addition, the portion not covered by the light-shielding layer of the anti-ESD photomask of the present disclosure has a high light transmittance (e.g. a transmittance of about 100% under ArF laser having a wavelength of 193 nm), and a critical dimension (CD) of the anti-ESD photomask remains unchanged (i.e. the critical dimension of the anti-ESD photomask remains the same whether the non-conductive layer is formed or not).

In some embodiments of the method of the present disclosure, a substrate is provided first. Then, a light-shielding layer is formed on a portion of the substrate, in which the light-shielding layer includes a Mo-containing layer. Next, a surface treatment operation is performed to convert a surface of the portion of the substrate and a surface of the light-shielding layer into a non-conductive layer.

In some embodiments of the method of the present disclosure, a substrate is provided first. Then, a light-shielding layer is formed on a portion of the substrate, in which the light-shielding layer includes a Mo-containing layer. Next, a non-conductive layer is directly formed on the light-shielding layer and the portion of the substrate.

In some embodiments of the present disclosure, the anti-ESD photomask includes a substrate, a light-shielding layer disposed on a portion of the substrate, and a non-conductive layer disposed on the light-shielding layer and the portion of substrate. The light-shielding layer includes a Mo-containing layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an anti-ESD photomask, the method comprising:
    providing a substrate;
    forming a light-shielding layer on a portion of the substrate, wherein the light-shielding layer comprises a Mo-containing layer; and
    performing a surface treatment operation to convert a surface of the portion of the substrate and a surface of the light-shielding layer into a non-conductive layer.

2. The method of claim 1, wherein the substrate is transparent and comprises quartz, silicon, silicon carbide, calcium fluoride, silicon oxide-titanium oxide alloy or combinations thereof, and the Mo-containing layer comprises MoSi, MoSiON or a combination thereof.

3. The method of claim 1, wherein the Mo-containing layer comprises metallic Mo of a first atomic percentage, the non-conductive layer comprises metallic Mo of a second atomic percentage, and the second atomic percentage is less than the first atomic percentage.

4. The method of claim 1, wherein the non-conductive layer has a thickness in a range substantially from 1 nm to 3 nm.

5. The method of claim 1, wherein the surface treatment operation is performed using $O_2$ plasma or $N_2$ plasma.

6. The method of claim 1, wherein the light-shielding layer further comprises an opaque layer disposed on the Mo-containing layer and exposing a portion of the Mo-containing layer.

7. The method of claim 6, wherein the opaque layer comprises metallic chromium, chromium oxide, chromium nitride, chromium oxynitride, or combinations thereof.

8. A method of forming an anti-ESD photomask, the method comprising:
providing a substrate;
forming a light-shielding layer on a portion of the substrate, wherein the light-shielding layer comprises a Mo-containing layer; and
forming a non-conductive layer directly on the light-shielding layer and the portion of the substrate.

9. The method of claim 8, wherein the substrate is transparent and comprises quartz, silicon, silicon carbide, calcium fluoride, silicon oxide-titanium oxide alloy or combinations thereof, and the Mo-containing layer comprises MoSi, MoSiON or a combination thereof.

10. The method of claim 8, wherein the non-conductive layer comprises SiO2, SiN, $MoO_2$, $MoN_2$, or a combination thereof.

11. The method of claim 8, wherein the non-conductive layer has a thickness in a range substantially from is 1 nm to 3 nm.

12. The method of claim 8, wherein forming the non-conductive layer directly on the light-shielding layer and the portion of the substrate comprises applying a chemical vapor deposition (CVD) process, a physical vapor deposition (PVD) process or an atomic layer deposition (ALD) process to the light-shielding layer and the portion of the substrate.

13. The method of claim 8, wherein the light-shielding layer further comprises an opaque layer disposed on the Mo-containing layer and exposing a portion of the Mo-containing layer.

14. The method of claim 13, wherein the opaque layer comprises metallic chromium, chromium oxide, chromium nitride, chromium oxynitride, or combinations thereof.

15. An anti-ESD photomask, comprising:
a substrate;
a light-shielding layer disposed on a portion of the substrate, wherein the light-shielding layer comprises a Mo-containing layer; and
a non-conductive layer disposed on the light-shielding layer and the portion of substrate.

16. The anti-ESD photomask of claim 15, wherein the Mo-containing layer comprises MoSi, MoSiON or a combination thereof.

17. The method of claim 15, wherein the Mo-containing layer comprises metallic Mo of a first atomic percentage, the non-conductive layer comprises metallic Mo of a second atomic percentage, and the second atomic percentage is less than the first atomic percentage.

18. The anti-ESD photomask of claim 15, wherein the non-conductive layer comprises $SiO_2$, SiN, $MoO_2$, $MoN_2$, or a combination thereof.

19. The anti-ESD photomask of claim 15, wherein the non-conductive layer has a thickness in a range substantially from is 1 nm to 3 nm.

20. The anti-ESD photomask of claim 15, wherein the light-shielding layer further comprises a chromium-containing layer disposed on the Mo-containing layer and exposing a portion of the Mo-containing layer.

* * * * *